United States Patent
Hoshino et al.

(10) Patent No.: US 10,683,414 B2
(45) Date of Patent: Jun. 16, 2020

(54) RESIN COMPOSITION

(71) Applicant: Denka Company Limited, Tokyo (JP)

(72) Inventors: Takako Hoshino, Shibukawa (JP); Yuki Hisha, Shibukawa (JP); Yoshitsugu Goto, Shibukawa (JP)

(73) Assignee: DENKA COMPANY LIMITED, Tokyo (JP)

( * ) Notice: Subject to any disclaimer, the term of this patent is extended or adjusted under 35 U.S.C. 154(b) by 556 days.

(21) Appl. No.: 15/113,724

(22) PCT Filed: Jan. 21, 2015

(86) PCT No.: PCT/JP2015/051575
§ 371 (c)(1),
(2) Date: Jul. 22, 2016

(87) PCT Pub. No.: WO2015/111635
PCT Pub. Date: Jul. 30, 2015

(65) Prior Publication Data
US 2017/0009071 A1    Jan. 12, 2017

(30) Foreign Application Priority Data
Jan. 23, 2014 (JP) ................................. 2014-010694

(51) Int. Cl.
| | | |
|---|---|---|
| *C08L 63/00* | (2006.01) | |
| *B32B 27/38* | (2006.01) | |
| *H01L 51/00* | (2006.01) | |
| *C09D 163/00* | (2006.01) | |
| *C08G 59/22* | (2006.01) | |
| *C08K 5/1515* | (2006.01) | |
| *C08G 59/40* | (2006.01) | |
| *C08G 59/06* | (2006.01) | |
| *C09J 163/00* | (2006.01) | |
| *C08G 59/68* | (2006.01) | |
| *H01L 51/52* | (2006.01) | |
| *H01L 51/10* | (2006.01) | |
| *H01L 51/56* | (2006.01) | |

(52) U.S. Cl.
CPC ............ *C08L 63/00* (2013.01); *C08G 59/063* (2013.01); *C08G 59/226* (2013.01); *C08G 59/4085* (2013.01); *C08K 5/1515* (2013.01); *C09D 163/00* (2013.01); *C09J 163/00* (2013.01); *H01L 51/0035* (2013.01); *B32B 27/38* (2013.01); *B32B 2305/30* (2013.01); *B32B 2457/206* (2013.01); *C08G 59/687* (2013.01); *C09J 2203/326* (2013.01); *H01L 51/107* (2013.01); *H01L 51/5246* (2013.01); *H01L 51/5253* (2013.01); *H01L 51/56* (2013.01)

(58) Field of Classification Search
CPC .......... B32B 2305/30; B32B 2457/206; B32B 27/38; C08K 5/5415; C08K 5/06; C08K 5/1515; C08L 63/00; C08G 59/4085; C08G 59/226; C08G 59/063; C08G 59/3209; C08G 59/025; C08G 59/687; H01L 51/0035; H01L 51/107; H01L 51/5253; H01L 51/56; H01L 51/5246; C09J 163/00; C09J 2203/326; C09D 163/00

See application file for complete search history.

(56) References Cited

U.S. PATENT DOCUMENTS

| 6,306,555 B1 | 10/2001 | Schulz et al. ............... 430/270.1 |
| 2005/0227082 A1 | 10/2005 | Shimazu et al. .............. 428/413 |
| 2010/0137530 A1 | 6/2010 | Arai et al. ..................... 525/524 |
| 2010/0304284 A1 | 12/2010 | Rinker ............................... 430/7 |
| 2012/0283352 A1* | 11/2012 | Nohara ................ C08G 59/226 522/166 |
| 2015/0210905 A1 | 6/2015 | Hishino et al. ......... C09J 163/00 |

FOREIGN PATENT DOCUMENTS

| EP | 2 660 927 A1 | 11/2013 |
| JP | 10-74583 A | 3/1998 |
| JP | 10-173336 A | 6/1998 |
| JP | 2001-181221 A | 7/2001 |
| JP | 2004-61925 A | 2/2004 |
| JP | 2005-302401 A | 10/2005 |
| JP | 2005-336314 A | 12/2005 |
| JP | 2007-254743 A | 10/2007 |
| JP | 2008-59868 A | 3/2008 |
| JP | 2008-59945 A | 3/2008 |
| JP | 2009-286954 A | 12/2009 |
| JP | 2010-507696 A | 3/2010 |
| JP | 2010-126699 A | 6/2010 |

(Continued)

OTHER PUBLICATIONS

Machine translation of JP 2005-302401. (Year: 2005).*

(Continued)

*Primary Examiner* — John D Freeman
(74) *Attorney, Agent, or Firm* — Stein IP, LLC

(57) ABSTRACT

A resin composition is provided that is capable of inhibiting degradation of the organic EL device. The resin composition, includes: (A) an alicyclic epoxy compound; (B) a bisphenol A epoxy resin; (C) a bisphenol F epoxy resin; and (D) a photocationic polymerization initiator. The bisphenol A epoxy resin (B) and the bisphenol F epoxy resin (C) are compounds not having the alicyclic epoxy compound (A) and the resin composition has a moisture content of 1000 ppm or less. Alternatively, the resin composition may further include a filler (H) and may have a moisture content of 50 ppm or more.

16 Claims, No Drawings

(56) References Cited

FOREIGN PATENT DOCUMENTS

| | | |
|---|---|---|
| JP | 2010-248500 A | 11/2010 |
| JP | 2011-111598 A | 6/2011 |
| JP | 2012-82297 A | 4/2012 |
| JP | 2012-136614 A | 7/2012 |
| JP | 2012-151109 A | 8/2012 |
| JP | 2013-23574 A | 2/2013 |
| JP | 2013157204 A * | 8/2013 |
| JP | 2013-186976 A | 9/2013 |
| WO | WO 2014/017524 A1 | 1/2014 |
| WO | WO 2015/029689 A1 | 3/2015 |

OTHER PUBLICATIONS

Machine translation of JP 2013-157204. (Year: 2013).*
International Search Report dated Apr. 21, 2015, issued to International Application No. PCT/JP2015/051575.

* cited by examiner

RESIN COMPOSITION

CROSS-REFERENCE TO RELATED APPLICATIONS

This application is a national stage of International Application No. PCT/JP2015/051575, filed Jan. 21, 2015, which claims the benefit of priority to Japanese Application No. 2014-010694, filed Jan. 23, 2014, in the Japanese Patent Office, the disclosures of which are incorporated in their entireties herein by reference.

TECHNICAL FIELD

The present invention relates to a resin composition. For example, it relates to an adhesive and a cured article used for sealing an organic EL device.

BACKGROUND ART

Organic EL devices have been gaining attention as a component capable of high intensity light emission. They have however a problem of reducing light emission properties by degradation due to moisture.

To solve such problem, examinations are given to a technique to prevent the degradation due to moisture by sealing an organic EL device. For example, there is a method of sealing with a sealing material of fritted glass (refer to Patent Literature 1 (PTL 1)).

There are also proposals for a method, not only of sealing a periphery of a base material, of sealing by filling between layers of a substrate for lamination. In this case, resin compositions to fill between layers are proposed (refer to PTLs 2 and 3).

Other than them, an energy ray curable resin composition is proposed that satisfies curability, adhesiveness, and storage stability (PTL 4).

Although being resin compositions used for other purposes, various resin compositions are also described in PTLs 5 through 7.

In a technique to seal an organic EL device, there is a description that a filled layer of a thermosetting resin material (not cured by ultraviolet irradiation) for sealing an organic EL device has a moisture content set at 0.01 wt % or less (PTL 8). PTL 8 also describes that a peripheral sealing layer of an ultraviolet curable resin material for sealing an organic EL device has a moisture content set at 0.1 wt % or less.

Although being a resin composition used for another purpose, a photosensitive additive adhesive having a hydrolyzable chlorine content of 100 ppm or less is described in PTL 9. PTL 10 describes a liquid crystal sealant having an amount of hydrolyzable chlorine of 600 ppm or less.

In a technique to seal an organic EL device, there is a description of addition of crown ether to a sealant for an organic EL device (PTL 11). Although being a resin composition used for another purpose, a photocurable resin composition for a touch screen is described to be added to crown ether (PTL 12).

CITATION LIST

Patent Literature

PLT 1: JP 10-74583A
PLT 2: JP 2005-336314A
PLT 3: JP 2008-59945A
PLT 4: JP 2010-248500A
PLT 5: JP 2009-286954A
PLT 6: JP 2010-507696A
PLT 7: JP 2001-181221A
PLT 8: JP 2008-59868A
PLT 9: JP 10-173336A
PLT 10: JP 2004-61925A
PLT 11: JP 2012-151109A
PLT 12: JP 2011-111598A

SUMMARY OF INVENTION

Technical Problem

The related art described in the above documents have, however, room for improvement in the following areas.

PTL 1 employs, for mass production, a method of sealing an outer periphery by sandwiching an organic EL device with a base material having low moisture permeability, for example, glass or the like. In this case, it has a hollow sealing structure, not capable of preventing entrance of moisture inside the hollow sealing structure, leading to a problem of degradation of the organic EL device.

In PTLs 2 and 3, the resin compositions have problems of degradation of the organic EL device due to the high moisture permeability and delamination of the organic EL device because sufficient adhesive strength is not secured. They also have a problem of degradation of the organic EL device due to metal corrosion because metal is deposited on the organic EL device.

PTL 4 has a problem that it is difficult to widely examine component composition of the resin composition for sealing an organic EL device and the like using various photopolymerization initiators without selecting a specific type of a photopolymerization initiator, such as bis-(4-t-butyl-phenyl)-iodonium-tris(trifluoromethanesulfonyl)methide.

PTLs 5 through 7 refer to the resin compositions originally used for other purposes, and there is no description on determination of the moisture contents.

Although the moisture content is determined, PTL 8 has problems of having insufficient adhesiveness and adhesion durability and causing a complex procedure of sealing an organic EL device because the composition is made by combining an overcoat layer containing an olefin resin or a cyclic olefin resin having carbon and hydrogen as main components, a filled layer containing an epoxy-based thermosetting resin material (not cured by ultraviolet irradiation), and a peripheral sealing layer containing an epoxy-based ultraviolet curable resin material.

Although the respective chlorine contents are determined, PTLs 9 and 10 refer to resin compositions originally used for other purposes, and there is no description on determination of the moisture contents.

Although PTLs 11 and 12 describes that crown ether is added to a sealant for an organic EL device or a photocurable resin composition for a touch screen, there is no description on determination of the moisture contents.

The present invention has been made in view of the above circumstances, and it is an object thereof to provide a resin composition that, when used for sealing an organic EL device, does not easily degrade the organic EL device.

Solution to Problem

The present invention is a resin composition, including: (A) an alicyclic epoxy compound; (B) a bisphenol A epoxy resin; (C) a bisphenol F epoxy resin; and (D) a photocationic polymerization initiator, wherein the bisphenol A epoxy resin (B) and the bisphenol F epoxy resin (C) are compounds not having the alicyclic epoxy compound (A) and the resin composition has a moisture content of 1000 ppm or less. Such resin composition, when used for sealing an organic EL device, does not easily degrade the organic EL device.

The present invention is also a resin composition, including: (A) an alicyclic epoxy compound; (B) a bisphenol A epoxy resin; (C) a bisphenol F epoxy resin; and (D) a photocationic polymerization initiator, wherein the bisphenol A epoxy resin (B) and the bisphenol F epoxy resin (C) are compounds not having the alicyclic epoxy compound (A), and the resin composition further comprises a filler (H) and has a moisture content of 50 ppm or more.

Such resin composition is capable of, when used for sealing an organic EL device, not easily degrading the organic EL device even in the case where the resin composition contains a lot of moisture content, which was an unrealistic case in the past.

It is preferred that the resin composition further includes a stabilizer (E).

It is preferred that the stabilizer (E) is an ether compound.

It is preferred that the stabilizer (E) is a cyclic ether compound.

It is preferred that the alicyclic epoxy compound (A) does not have an aromatic group.

It is preferred that the resin composition further includes a silane coupling agent (F).

It is preferred that the resin composition further includes a sensitizer (G).

It is preferred that the resin composition has a moisture content from not less than 50 ppm and not more than 700 ppm.

It is preferred that the resin composition has shear viscosity not less than 5 mPa·s and not more than 2000 at 25° C.

The above resin compositions are embodiments of the present invention, and an adhesive, a sealant for an organic EL device, a cured article, an organic EL apparatus, a display, and methods of manufacturing the same of the present invention have same configuration and effects.

Advantageous Effects of Invention

According to the present invention, it is possible to inhibit degradation of an organic EL device.

DESCRIPTION OF EMBODIMENTS

<Description of Terms>

An energy ray curable resin composition herein means a resin composition capable of being cured by energy ray irradiation. Here, the energy ray means energy rays represented by ultraviolet rays, visible rays, and the like.

The symbol "-" herein means a range between the end values both "inclusive". For example, "A-B" means not less than A and also not more than B.

Embodiments of the present invention are described in detail below.

First Embodiment: Resin Composition

A resin composition in the present embodiment is preferably an energy ray curable resin composition. The energy ray curable resin composition contains: (A) an alicyclic epoxy compound; (B) a bisphenol A epoxy resin; (C) a bisphenol F epoxy resin; and (D) a photocationic polymerization initiator.

The bisphenol A epoxy resin (B) and the bisphenol F epoxy resin (C) are compounds not having the alicyclic epoxy compound (A).

Components of the resin composition in the present embodiment are then described.

((A) Alicyclic Epoxy Compound)

The resin composition in the present embodiment contains an alicyclic epoxy compound (A). The use of the alicyclic epoxy compound (A) allows the resin composition in the present embodiment to exhibit excellent adhesiveness, low moisture permeability, adhesion durability, and photocurability.

Examples of the alicyclic epoxy compound (A) include compounds, or derivatives thereof, obtained by epoxidizing a compound having at least one cycloalkane ring, such as a cyclohexene or cyclopenten ring and a pinene ring, with a suitable oxidizing agent, such as hydrogen peroxide and peracid; hydrogenated epoxy compounds obtained by hydrogenating an aromatic epoxy compound, such as a bisphenol A epoxy compound; modified products of a compound having a cycloalkane ring modified to have a glycidyl ether structure; and the like. These compounds may be used by selecting one or more of them. The alicyclic epoxy compound (A) preferably does not have an aromatic group.

Although not being limited in particular, examples of the alicyclic epoxy compound include alicyclic epoxy compounds having one or more epoxy groups and one or more ester groups in one molecule, such as 3,4-epoxycyclohexenylmethyl-3',4'-epoxycyclohexene carboxylate and 3,4-epoxycyclohexylmethyl (meth)acrylate; epoxy compounds having a dicyclopentadiene structure; and the like.

Among these, from the perspective of excellent adhesiveness and photocurability, alicyclic epoxy compounds containing one or more epoxy groups and one or more ester groups in one molecule are more preferred.

From the perspective of moisture permeability and stability, the alicyclic epoxy compound preferably has a molecular weight of 450 or less, more preferably 400 or less, even more preferably less than 300, and more preferably from 100 to 280. The molecular weight refers to a number-average molecular weight. For the molecular weight, a number-average molecular weight is used that is measured by GPC (gel permeation chromatography) in terms of polystyrene. For example, measurement is performed in the following conditions.

Solvent (Mobile Phase): THF
Deaerator: ERC-3310 manufactured by ERMA Inc.
Pump: PU-980 manufactured by JASCO Corp.
Flow Rate: 1.0 ml/min
Autosampler: AS-8020 manufactured by Tosoh Corp.
Column Oven: L-5030 manufactured by Hitachi, Ltd.
Temperature Setting: 40° C.
Column Structure: 2 Columns of TSK guardcolumn MP (XL) manufactured by Tosoh Corp. 6.0 mm ID×4.0 cm and 2 Columns of TSK-GELMULTIPORE HXL-M manufactured by Tosoh Corp. 7.8 mm ID×30.0 cm, 4 Columns in Total
Detector: RI, L-3350 manufactured by Hitachi, Ltd.
Data Processing: SIC480 Data Station The amount of the component (A) to be used is, from the perspective of workability, photocurability, adhesiveness, moisture permeability, and adhesion durability, preferably 5 parts by mass or more based on 100 parts by mass of (A), (B), and (C) in total, more preferably 10 parts by mass or more, even more preferably 30 parts by mass or more, and most preferably 40 parts by mass or more. The amount of the component (A) to be used is, from the perspective of workability, photocurability, adhesiveness, moisture permeability, and adhesion durability, preferably 95 parts by mass or less based on 100 parts by mass of (A), (B), and (C) in total, more preferably 90 parts by mass or less, even more preferably 80 parts by mass or less, and most preferably 70 parts by mass or less.

((B) Bisphenol A Epoxy Resin)

The resin composition in the present embodiment contains a bisphenol A epoxy resin (B).

The bisphenol A epoxy resin (B) refers to, for example, a condensation product of bisphenol A and epichlorohydrin in the presence of an alkali catalyst. Further, a modified epoxy resin or the like may be used in which an epoxy group or a hydroxyl group in the bisphenol A epoxy resin is reacted with vegetable oil fatty acid or a modifier.

The bisphenol A epoxy resin (B) herein does not contain a bisphenol A epoxy resin having an alicyclic epoxy compound.

The bisphenol A epoxy resin (B) has a molecular weight, from the perspective of moisture permeability and the like, preferably from 100 to 5000, more preferably from 150 to 1000, and most preferably from 200 to 450. Here, the molecular weight refers to a number-average molecular weight. For the molecular weight, a number-average molecular weight is used that is measured by GPC (gel permeation chromatography) in terms of polystyrene.

((C) Bisphenol F Epoxy Resin)

The resin composition in the present embodiment contains a bisphenol F epoxy resin (C). The bisphenol F epoxy resin (C) herein does not contain a bisphenol F epoxy resin having an alicyclic epoxy compound.

The bisphenol F epoxy resin (C) refers to, for example, a condensation product of bisphenol F and epichlorohydrin in the presence of an alkali catalyst. Further, a modified epoxy resin or the like may be used in which an epoxy group or a hydroxyl group in the bisphenol F epoxy resin is reacted with vegetable oil fatty acid or a modifier.

The bisphenol F epoxy resin (C) has a molecular weight, from the perspective of moisture permeability and the like, preferably from 100 to 5000, preferably from 150 to 1000, and most preferably from 200 to 450. Here, the molecular weight refers to a number-average molecular weight. For the molecular weight, a number-average molecular weight is used that is measured by GPC (gel permeation chromatography) in terms of polystyrene.

The mass ratio of the component (B) to the component (C) is preferably (B):(C)=from 1:5 to 5:1, preferably (B):(C) =from 1:3 to 3:1, and most preferably (B):(C)=1:1.

((D) Photocationic Polymerization Initiator)

The resin composition in the present embodiment contains a photocationic polymerization initiator (D). When a photocationic polymerization initiator is used, the resin composition in the present embodiment is curable by irradiation of energy rays, such as ultraviolet rays.

Although not being limited in particular, examples of the photocationic polymerization initiator (D) include acid generators, such as aryl sulfonium salt derivatives (for example, Cyracure UVI-6990 and Cyracure UVI-6974 produced by Dow Chemicals Co.; Adeka Optomer SP-150, Adeka Optomer SP-152, Adeka Optomer SP-170, and Adeka Optomer SP-172 produced by Asahi Denka Co., Ltd.; CPI-100P, CPI-101A, CPI-200K, CPI-210S, and LW-S1 produced by San-Apro Ltd.; Chivacure 1190 produced by Double Bond Chemical Industries Co., Ltd.; etc.), aryl iodonium salt derivatives (for example, Irgacure 250 produced by Ciba Specialty Chemicals Inc. and RP-2074 produced by Rhodia Japan Ltd.), allene-ion complex derivatives, diazonium salt derivatives, triazine-based initiators, and other halides. The cationic species of the photocationic polymerization initiator is preferably onium salt represented by the formula (1) below.

Although not being limited in particular, examples of the photocationic polymerization initiator (D) include onium salt represented by the formula (1) below.

[Chem. 1]

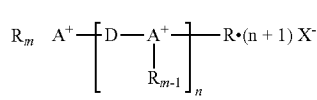

Formula (1)

(A denotes an element from VIA group to VIIA group having a valence of m. The symbol m=from 1 to 2. The symbol n=from 0 to 3. The symbols m and n are preferably integers. R denotes an organic group bonded to A. D denotes a structure represented by the formula (2) below.)

[Chem. 2]

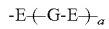

Formula (2)

(In the formula (2), E denotes a divalent group and G denotes —O—, —S—, —SO—, —SO$_2$—, —NH—, —NR'—, —CO—, —COO—, —CONH—, an alkylene group or a phenylene group having a carbon number from 1 to 3 (R' denotes an alkyl group having a carbon number from 1 to 5 or an aryl group having a carbon number from 6 to 10). The symbol a=from 0 to 5. Both a+1 of E(s) and a of G(s) may be identical or different from each other. The symbol a is preferably an integer. Here, R' is same as above. X$^-$ denotes a counter ion to onium and the number thereof is n+1 per molecule.)

Although not being limited in particular, examples of the onium ion of the compound in the formula (1) include 4-(phenylthio)phenyldiphenylsulfonium, bis[4-(diphenyl-sulfonio)phenyl]sulfide, bis[4-{bis[4-(2-hydroxyethoxy) phenyl]sulfonio}phenyl]sulfide, bis{4-[bis(4-fluorophenyl) sulfonio]phenyl}sulfide, 4-(4-benzoyl-2-chlorophenylthio) phenylbis(4-fluorophenyl)sulfonium, 4-(4-benzoylphenylthio)phenyldiphenylsulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(di-p-tolyl) sulfonio]thioxanthone, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, 5-(4-methoxyphenyl)thianthrenium, 5-phenylthianthrenium, diphenylphenacylsulfonium, 4-hydroxyphenylmethylbenzylsulfonium, 2-naphthylmethyl(1-ethoxycarbonyl) ethylsulfonium, 4-hydroxyphenylmethylphenacylsulfonium, octadecylmethylphenacylsulfonium, and the like.

R denotes an organic group bonded to A and represents an aryl group having a carbon number from 6 to 30, a heterocyclic group having a carbon number from 4 to 30, an alkyl group having a carbon number from 1 to 30, an alkenyl group having a carbon number from 2 to 30, or an alkynyl group having a carbon number from 2 to 30. They may be substituted by at least one selected from the group consisting of halogen and each group of alkyl, hydroxy, alkoxy, alkylcarbonyl, arylcarbonyl, alkoxycarbonyl, aryloxycarbonyl, arylthiocarbonyl, acyloxy, arylthio, alkylthio, aryl, heterocyclic, aryloxy, alkylsulfinyl, arylsulfinyl, alkylsulfonyl, arylsulfonyl, alkyleneoxy, amino, cyano, and nitro. The number of R is m+n(m−1)+1 and may be identical or different from each other. In addition, two or more Rs may be bonded directly to each other or via —O—, —S—, —SO—, —SO$_2$—, —NH—, —NR'—, —CO—, —COO—, —CONH—, or an alkylene group or a phenylene group having a carbon number from 1 to 3 to form a ring structure containing the element A. Here, R' denotes an alkyl group having a carbon number from 1 to 5 or an aryl group having a carbon number from 6 to 10.

Examples of the aryl group having a carbon number from 6 to 30 in the above description include monocyclic aryl groups, such as a phenyl group; and condensation polycyclic aryl groups, such as naphthyl, anthracenyl, phenanthrenyl, pyrenyl, chrysenyl, naphthacenyl, benzanthracenyl, anthraquinolyl, fluorenyl, naphthoquinone, and anthraquinone.

Examples of the heterocyclic group having a carbon number from 4 to 30 include cyclic groups containing from one to three heteroatoms, such as oxygen, nitrogen, and sulfur, and they may be identical or different from each other. Specific examples include monocyclic heterocyclic groups, such as thienyl, furanyl, pyranyl, pyrrolyl, oxazolyl, thiazolyl, pyridyl, pyrimidyl, and pyrazinyl; and condensation polycyclic heterocyclic groups, such as indolyl, benzofuranyl, isobenzofuranyl, benzothienyl, isobenzothienyl, quinolyl, isoquinolyl, quinoxalinyl, quinazolinyl, carbazolyl, acridinyl, phenothiadinyl, phenazinyl, xanthenyl, thianthrenyl, phenoxazinyl, phenoxathiinyl, chromanyl, isochromanyl, dibenzothienyl, xanthonyl, thioxanthonyl, and dibenzofuranyl.

Examples of the alkyl group having a carbon number from 1 to 30 include linear alkyl groups, such as methyl, ethyl, propyl, butyl, pentyl, octyl, decyl, dodecyl, tetradecyl, hexadecyl, and octadecyl; branched alkyl groups, such as isopropyl, isobutyl, sec-butyl, tert-butyl, isopentyl, neopentyl, tert-pentyl, and isohexyl; cycloalkyl groups, such as cyclopropyl, cyclobutyl, cyclopentyl, and cyclohexyl; and aralkyl groups, such as benzyl, naphthylmethyl, anthracenylmethyl, 1-phenylethyl, and 2-phenylethyl.

Examples of the alkenyl group having a carbon number from 2 to 30 include linear or branched ones, such as vinyl, allyl, 1-propenyl, isopropenyl, 1-butenyl, 2-butenyl, 3-butenyl, 1-methyl-1-propenyl, 1-methyl-2-propenyl, 2-methyl-1-propenyl, 2-methyl-2-propenyl, 1-pentenyl, 2-pentenyl, 3-pentenyl, 4-pentenyl, 1-methyl-1-butenyl, 2-methyl-2-butenyl, 3-methyl-2-butenyl, 1,2-dimethyl-1-propenyl, 1-decenyl, 2-decenyl, 8-decenyl, 1-dodecenyl, 2-dodecenyl, and 10-dodecenyl; cycloalkenyl groups, such as 2-cyclohexenyl and 3-cyclohexenyl; and arylalkenyl groups, such as styryl and cinnamyl.

Further, examples of the alkynyl group having a carbon number from 2 to 30 include linear or branched ones, such as ethynyl, 1-propynyl, 2-propynyl, 1-butynyl, 2-butynyl, 3-butynyl, 1-methyl-2-propynyl, 1,1-dimethyl-2-propynyl, 1-pentinyl, 2-pentinyl, 3-pentinyl, 4-pentinyl, 1-decynyl, 2-decynyl, 8-decynyl, 1-dodecynyl, 2-dodecynyl, and 10-dodecynyl; and arylalkynyl groups, such as phenylethynyl.

The aryl group having a carbon number from 6 to 30, the heterocyclic group having a carbon number from 4 to 30, the alkyl group having a carbon number from 1 to 30, the alkenyl group having a carbon number from 2 to 30, or the alkynyl group having a carbon number from 2 to 30 described above may have at least one substituent. Examples of the substituent include linear alkyl groups having a carbon number from 1 to 18, such as methyl, ethyl, propyl, butyl, pentyl, octyl, decyl, dodecyl, tetradecyl, hexadecyl, and octadecyl; branched alkyl groups having a carbon number from 1 to 18, such as isopropyl, isobutyl, sec-butyl, tert-butyl, isopentyl, neopentyl, tert-pentyl, and isohexyl; cycloalkyl groups having a carbon number from 3 to 18, such as cyclopropyl, cyclobutyl, cyclopentyl, and cyclohexyl; hydroxyl groups; linear or branched alkoxy groups having a carbon number from 1 to 18, such as methoxy, ethoxy, propoxy, isopropoxy, butoxy, isobutoxy, sec-butoxy, tert-butoxy, hexyloxy, decyloxy, and dodecyloxy; linear or branched alkylcarbonyl groups having a carbon number from 2 to 18, such as acetyl, propionyl, butanoyl, 2-methylpropionyl, heptanoyl, 2-methylbutanoyl, 3-methylbutanoyl, octanoyl, decanoyl, dodecanoyl, and octadecanoyl; arylcarbonyl groups having a carbon number from 7 to 11, such as benzoyl and naphthoyl; linear or branched alkoxycarbonyl groups having a carbon number from 2 to 19, such as methoxycarbonyl, ethoxycarbonyl, propoxycarbonyl, isopropoxycarbonyl, butoxycarbonyl, isobutoxycarbonyl, sec-butoxycarbonyl, tert-butoxycarbonyl, octyloxycarbonyl, tetradecyloxycarbonyl, and octadecyloxycarbonyl; aryloxycarbonyl groups having a carbon number from 7 to 11, such as phenoxycarbonyl and naphthoxycarbonyl; arylthiocarbonyl groups having a carbon number from 7 to 11, such as phenylthiocarbonyl and naphthoxythiocarbonyl; linear or branched acyloxy groups having a carbon number from 2 to 19, such as acetoxy, ethylcarbonyloxy, propylcarbonyloxy, isopropylcarbonyloxy, butylcarbonyloxy, isobutylcarbonyloxy, sec-butylcarbonyloxy, tert-butylcarbonyloxy, octylcarbonyloxy, tetradecylcarbonyloxy, and octadecylcarbonyloxy; arylthio groups having a carbon number from 6 to 20, such as phenylthio, 2-methylphenylthio, 3-methylphenylthio, 4-methylphenylthio, 2-chlorophenylthio, 3-chlorophenylthio, 4-chlorophenylthio, 2-bromophenylthio, 3-bromophenylthio, 4-bromophenylthio, 2-fluorophenylthio, 3-fluorophenylthio, 4-fluorophenylthio, 2-hydroxyphenylthio, 4-hydroxyphenylthio, 2-methoxyphenylthio, 4-methoxyphenylthio, 1-naphthylthio, 2-naphthylthio, 4-[4-(phenylthio)benzoyl]phenylthio, 4-[4-(phenylthio)phenoxy]phenylthio, 4-[4-(phenylthio)phenyl]phenylthio, 4-(phenylthio)phenylthio, 4-benzoylphenylthio, 4-benzoyl-2-chlorophenylthio, 4-benzoyl-3-chlorophenylthio, 4-benzoyl-3-methylthiophenylthio, 4-benzoyl-2-methylthiophenylthio, 4-(4-methylthiobenzoyl)phenylthio, 4-(2-methylthiobenzoyl)phenylthio, 4-(p-methylbenzoyl)phenylthio, 4-(p-ethylbenzoyl)phenylthio4-(p-isopropylbenzoyl)phenylthio, and 4-(p-tert-butylbenzoyl)phenylthio; linear or branched alkylthio groups having a carbon number from 1 to 18, such as methylthio, ethylthio, propylthio, isopropylthio, butylthio, isobutylthio, sec-butylthio, tert-butylthio, pentylthio, isopentylthio, neopentylthio, tert-pentylthio, octylthio, decylthio, and dodecylthio; aryl groups having a carbon number from 6 to 10, such as phenyl, tolyl, dimethylphenyl, and naphthyl; heterocyclic groups having a carbon number from 4 to 20, such as thienyl, furanyl, pyranyl, pyrrolyl, oxazolyl, thiazolyl, pyridyl, pyrimidyl, pyrazinyl, indolyl, benzofuranyl, benzothienyl, quinolyl, isoquinolyl, quinoxalinyl, quinazolinyl, carbazolyl, acridinyl, phenothiadinyl, phenazinyl, xanthenyl, thianthrenyl, phenoxazinyl, phenoxathiinyl, chromanyl, isochromanyl, dibenzothienyl, xanthonyl, thioxanthonyl, and dibenzofuranyl; aryloxy groups having a carbon number from 6 to 10, such as phenoxy and naphthyloxy; linear or branched alkylsulfinyl groups having a carbon number from 1 to 18, such as methylsulfinyl, ethylsulfinyl, propylsulfinyl, isopropylsulfinyl, butylsulfinyl, isobutylsulfinyl, sec-butylsulfinyl, tert-butylsulfinyl, pentylsulfinyl, isopentylsulfinyl, neopentylsulfinyl, tert-pentylsulfinyl, and octylsulfinyl; arylsulfinyl groups having a carbon number from 6 to 10, such as phenylsulfinyl, tolylsulfinyl, and naphthylsulfinyl; linear or branched alkylsulfonyl groups having a carbon number from 1 to 18, such as methylsulfonyl, ethylsulfonyl, propylsulfonyl, isopropylsulfonyl, butylsulfonyl, isobutylsulfonyl, sec-butylsulfonyl, tert-butylsulfonyl, pentylsulfonyl, isopentylsulfonyl, neopentylsulfonyl, tert-pentylsulfonyl, and octylsulfonyl; arylsulfonyl groups having a carbon number from 6 to 10, such as phenylsulfonyl, tolylsulfonyl (tosyl group), and naphthylsulfonyl; and alkyleneoxy groups represented by the formula (3) below (Q denotes a hydrogen atom or a methyl group, and k denotes an integer from 1 to 5).

[Chem. 3]

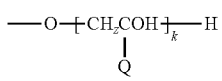

Formula (3)

Examples include an unsubstituted amino group and an amino group monosubstituted or disubstituted by alkyl having a carbon number from 1 to 5 and/or aryl having a carbon number from 6 to 10 (Specific examples of the alkyl group having a carbon number from 1 to 5 include linear alkyl groups, such as methyl, ethyl, propyl, butyl, and pentyl; branched alkyl groups, such as isopropyl, isobutyl, sec-butyl, tert-butyl, isopentyl, neopentyl, and tert-pentyl; and cycloalkyl groups, such as cyclopropyl, cyclobutyl, and cyclopentyl. Specific examples of the aryl group having a carbon number from 6 to 10 include phenyl, naphthyl, and the like.); cyano groups; nitro groups; halogens, such as fluorine, chlorine, bromine, and iodine; and the like.

In addition, examples of the formation of a ring structure containing the element A by bonding two or more Rs directly to each other or via —O—, —S—, —SO—, —SO$_2$—, —NH—, —NR'— (R' denotes an alkyl group having a carbon number from 1 to 5 or an aryl group having a carbon number from 6 to 10. Specific examples of the alkyl group having a carbon number from 1 to 5 include linear alkyl groups, such as methyl, ethyl, propyl, butyl, and pentyl; branched alkyl groups, such as isopropyl, isobutyl, sec-butyl, tert-butyl, isopentyl, neopentyl, and tert-pentyl; and cycloalkyl groups, such as cyclopropyl, cyclobutyl, and cyclopentyl. Specific examples of the aryl group having a carbon number from 6 to 10 include phenyl, naphthyl, and the like.), —CO—, —COO—, —CONH—, an alkylene or phenylene group having a carbon number from 1 to 3 include the following.

[Chem. 4]

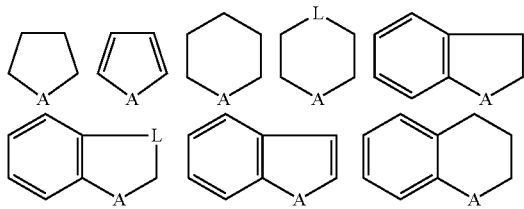

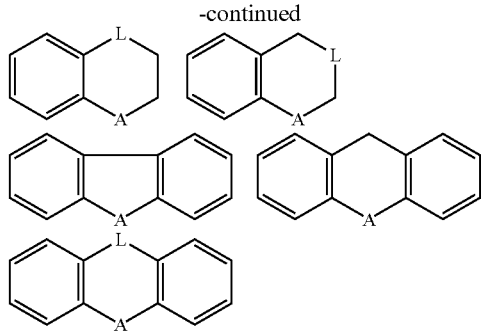

etc.

[A denotes an element from VIA group to VIIA group (CAS expression), and L denotes —O—, —S—, —SO—, —SO$_2$—, —NH—, —NR'—, —CO—, —COO—, —CONH—. R' is same as above.]

In the formula (1), m+n(m−1)+1 of Rs bonded to the element A from VIA group to VIIA group (CAS expression) having a valence of m may be identical or different from each other, whereas at least one R, even more preferably all Rs, is aryl having a carbon number from 6 to 30 or a heterocyclic group having a carbon number from 4 to 30 that may have the substituent described above.

D in the formula (1) is expressed in the structure of the formula (2) below.

[Chem. 5]

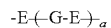

Formula (2)

E in the formula (2) denotes a linear, branched, or cyclic alkylene group having a carbon number from 1 to 8, such as methylene, ethylene, and propylene; an arylene group having a carbon number from 6 to 20, such as phenylene, xylylene, naphthylene, biphenylene, and anthracenylene; and a divalent group of a heterocyclic compound having a carbon number from 8 to 20, such as dibenzofurandiyl, dibenzothiophenediyl, xanthenediyl, phenoxathiindiyl, thianthrenediyl, bithiophenediyl, bifurandiyl, thioxanthonediyl, xanthonediyl, carbazolediyl, acridinediyl, phenothiazinediyl, and phenazinediyl. Here, the divalent group of a heterocyclic compound refers to a divalent group produced by removing one hydrogen atom each from two ring carbon atoms with a different heterocyclic compound.

The alkylene group, the arylene group, or the divalent group of a heterocyclic compound may have at least one substituent. Specific examples of the substituent include linear alkyl groups having a carbon number from 1 to 8, such as methyl, ethyl, propyl, butyl, pentyl, and octyl; branched alkyl groups having a carbon number from 1 to 8, such as isopropyl, isobutyl, sec-butyl, and tert-butyl; cycloalkyl groups having a carbon number from 3 to 8, such as cyclopropyl and cyclohexyl; alkoxy groups having a carbon number from 1 to 8, such as methoxy, ethoxy, propoxy, butoxy, and hexyloxy; aryl groups having a carbon number from 6 to 10, such as phenyl and naphthyl; hydroxyl groups; cyano groups; nitro groups; and halogens, such as fluorine, chlorine, bromine, and iodine.

G in the formula (2) denotes —O—, —S—, —SO—, —SO$_2$—, —NH—, —NR'— (R' is same as above), —CO—, —COO—, —CONH—, or an alkylene or phenylene group having a carbon number from 1 to 3. Examples of the alkylene group having a carbon number from 1 to 3 include linear or branched alkylene groups, such as methylene, ethylene, and propylene.

The symbol a in the formula (2) denotes an integer from 0 to 5. Both a+1 of E(s) and a of G(s) may be identical or different from each other.
Representative examples of D represented by the formula (2) in the formula (1) are shown below.
[Chem. 6]
In case of a = 0,
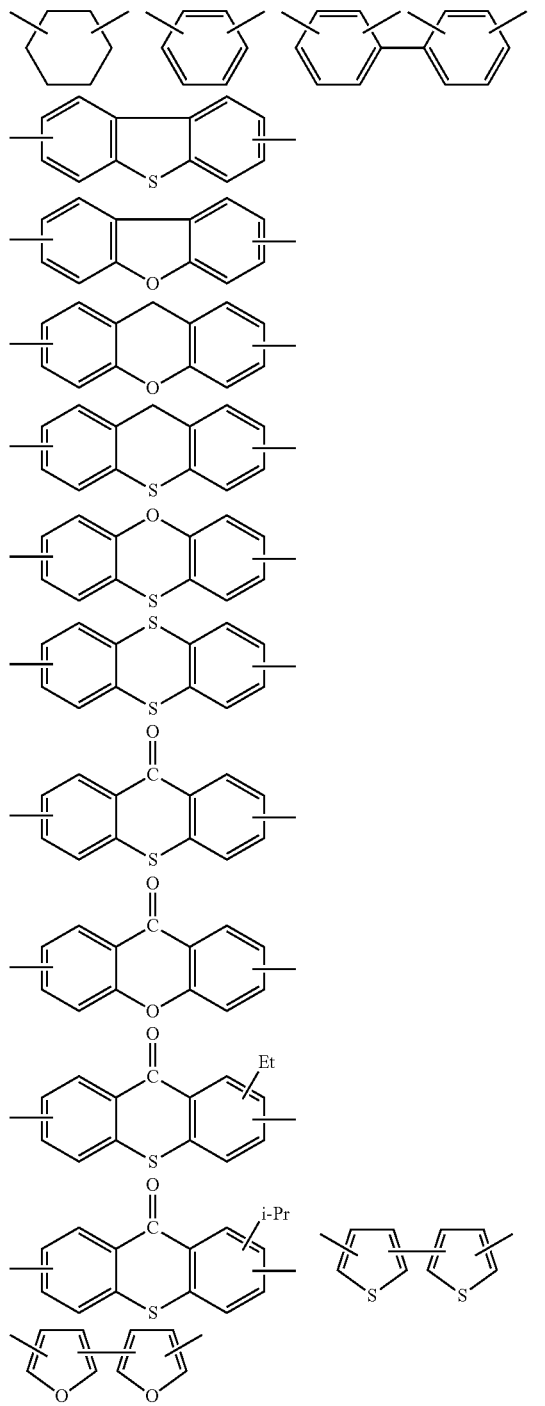
[Chem. 7]
In case of a = 1,
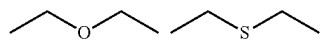
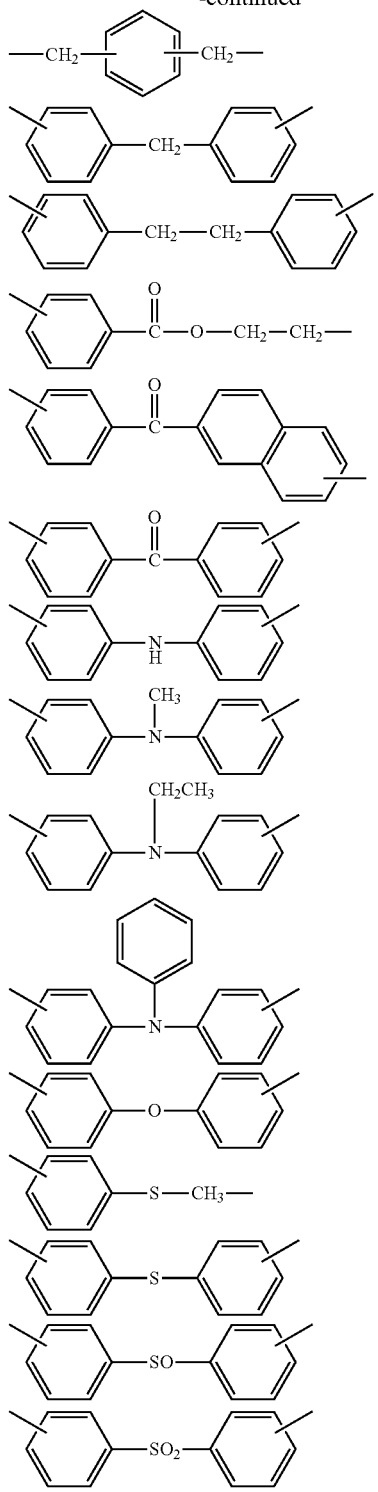
[Chem. 8]
In case of a = 2,
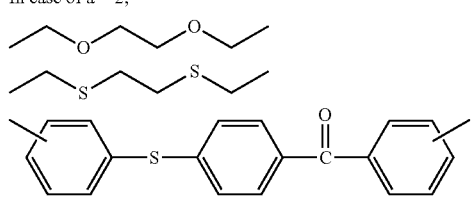

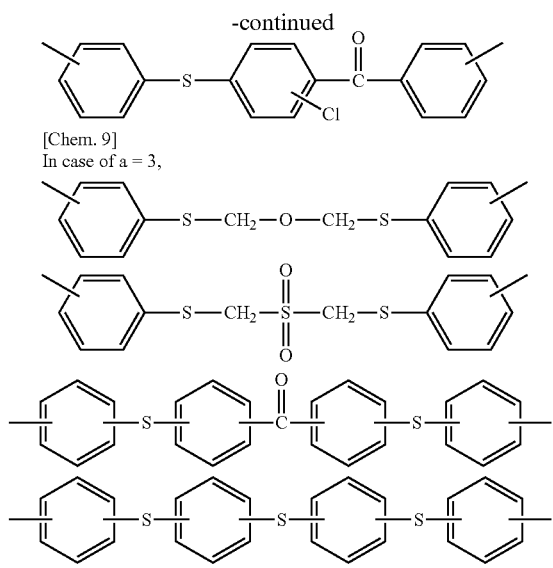

[Chem. 9]
In case of a = 3,

The symbol n in the formula (1) denotes the number of repeating units of [D-A⁺R$_{m-1}$] bond and it is preferably an integer from 0 to 3.

A preferred onium ion [A⁺] in the formula (1) includes sulfonium, iodonium, and selenium, and its representative examples include the followings.

Examples of the sulfonium ion include triarylsulfonium, such as triphenylsulfonium, tri-p-tolylsulfonium, tri-o-tolylsulfonium, tris(4-methoxyphenyl)sulfonium, 1-naphthyl diphenylsulfonium, 2-naphthyl diphenylsulfonium, tris(4-fluorophenyl)sulfonium, tri-1-naphthylsulfonium, tri-2-naphthylsulfonium, tris(4-hydroxyphenyl)sulfonium, 4-(phenylthio)phenyldiphenylsulfonium, 4-(p-tolylthio)phenyldi-p-tolylsulfonium, 4-(4-methoxyphenylthio)phenylbis(4-methoxphenyl)sulfonium, 4-(phenylthio)phenylbis(4-fluorophenyl)sulfonium, 4-(phenylthio)phenylbis(4-methoxyphenyl)sulfonium, 4-(phenylthio)phenyldi-p-tolylsulfonium, bis[4-(diphenylsulfonio)phenyl]sulfide, bis(4-{bis[4-(2-hydroxyethoxy)phenyl]sulfonio}phenyl] sulfide, bis{4-[bis(4-fluorophenyl)sulfonio]phenyl}sulfide, bis{4-[bis(4-methylphenyl)sulfonio]phenyl}sulfide, bis{4-[bis(4-methoxyphenyl)sulfonio]phenyl}sulfide, 4-(4-benzoyl-2-chlorophenylthio)phenylbis(4-fluorophenyl)sulfonium, 4-(4-benzoyl-2-chlorophenylthio)phenyldiphenylsulfoniunn, 4-(4-benzoylphenylthio)phenylbis(4-fluorophenyl)sulfonium, 4-(4-benzoylphenylthio)phenyldiphenylsulfoniunn, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(di-p-tolyl)sulfonio]thioxanthone, 2-[(diphenyl)sulfonio]thioxanthone, 4-[4-(4-tert-butylbenzoyl)phenylthio]phenyldi-p-tolylsulfonium, 4-[4-(4-tert-butylbenzoyl)phenylthio]phenyldiphenylsulfoniunn, 4-[4-(benzoylphenylthio)]phenyldi-p-tolylsulfonium, 4-[4-(benzoylphenylthio)]phenyldiphenylsulfonium, 5-(4-methoxyphenyl)thianthrenium, 5-phenylthianthrenium, 5-tolyithianthrenium, 5-(4-ethoxyphenyl)thianthrenium, and 5-(2,4,6-trimethylphenyl)thianthrenium; diarylsulfonium, such as diphenylphenacylsulfonium, diphenyl-4-nitrophenacylsulfonium, diphenylbenzylsulfonium, and diphenylmethylsulfonium; monoarylsulfonium, such as phenylmethylbenzylsulfonium, 4-hydroxyphenylmethylbenzylsulfonium, 4-methoxyphenylmethylbenzylsulfonium, 4-acetocarbonyloxy phenylmethylbenzylsulfonium, 2-naphthylmethyl benzylsulfonium, 2-naphthylmethyl(1-ethoxycarbonyl)ethylsulfonium, phenylmethylphenacylsulfonium, 4-hydroxyphenylmethylphenacylsulfonium, 4-methoxyphenyl methylphenacylsulfonium, 4-acetocarbonyloxy phenylmethylphenacylsulfonium, 2-naphthylmethyl phenacylsulfonium, 2-naphthyloctadecyl phenacylsulfonium, and 9-anthracenylmethylphenacylsulfonium; trialkylsulfonium, such as dimethylphenacylsulfonium, phenacyltetrahydrothiophenium, dimethylbenzylsulfonium, benzyltetrahydrothiophenium, and octadecylmethylphenacylsulfonium; and the like.

Examples of the iodonium ion include diphenyliodonium, di-p-tolyliodonium, bis(4-dodecylphenyl)iodonium, bis(4-methoxyphenyl)iodonium, (4-octyloxyphenyl)phenyliodonium, bis(4-decyloxyphenyl)iodonium, 4-(2-hydroxytetradecyloxy)phenylphenyliodonium, 4-isopropylphenyl(p-tolyl)iodonium, and isobutylphenyl(p-tolyl)iodonium.

Examples of the selenium ion include triarylselenium, such as triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphthylselenium, tri-2-naphthylselenium, tris(4-hydroxyphenyl)selenium, 4-(phenylthio)phenyldiphenylselenium, and 4-(p-tolylthio)phenyldi-p-tolylselenium; diarylselenium, such as diphenylphenacylselenium, diphenylbenzylselenium, and diphenylmethylselenium; monoarylselenium, such as phenylmethylbenzylselenium, 4-hydroxyphenyl methylbenzylselenium, phenylmethylphenacylselenium, 4-hydroxyphenyl methylphenacylselenium, and 4-methoxyphenyl methylphenacylselenium; trialkylselenium, such as dimethylphenacylselenium, phenacyltetrahydroselenophenium, dimethylbenzylselenium, benzyltetrahydroselenophenium, and octadecylmethylphenacylselenium; and the like.

Among these oniums, sulfonium iodonium are preferred. Examples of particularly preferred ones include one or more of the group consisting of: sulfonium ions, such as triphenylsulfonium, tri-p-tolylsulfonium, 4-(phenylthio)phenyldiphenylsulfonium, bis[4-(diphenylsulfonio)phenyl]sulfide, bis(4-{bis[4-(2-hydroxyethoxy)phenyl]sulfonio}phenyl] sulfide, bis{4-[bis(4-fluorophenyl)sulfonio]phenyl}sulfide, 4-(4-benzoyl-2-chlorophenylthio)phenylbis(4-fluorophenyl)sulfonium, 4-(4-benzoylphenylthio)phenyldiphenylsulfonium, 7-isopropyl -9-oxo-10-thia-9,10-dihydroanthracene -2-yldi-p-tolylsulfonium, 7-isopropyl -9-oxo-10-thia-9,10-dihydroanthracene-2-yldiphenylsulfonium, 2-[(di-p-tolyl) sulfonio]thioxanthone, 2-[(diphenyl)sulfonio]thioxanthone, 4-[4-(4-tert-butylbenzoyl)phenylthio]phenyldi-p-tolylsulfonium, 4-[4-(benzoylphenylthio)]phenyldiphenylsulfonium, 5-(4-methoxyphenyl)thianthrenium, 5-phenylthianthrenium, diphenylphenacylsulfonium, 4-hydroxyphenylmethylbenzylsulfonium, 2-naphthylmethyl(1-ethoxycarbonyl) ethylsulfonium, 4-hydroxyphenylmethylphenacylsulfonium, and octadecylmethylphenacylsulfonium; and iodonium ions, such as diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

X⁻ in the formula (1) is a counter ion. The number thereof is n+1 per molecule. Although not being limited in particular, the counter ion may be halides of, for example, a boron compound, a phosphorus compound, an antimony compound, an arsenic compound, and an alkyl sulfonate compound; methide compounds; and the like. Examples include halide ions, such as F⁻, Cl⁻, Br⁻, and I⁻; sulfonate ions, such as OH⁻, ClO$_4^-$, FSO$_3^-$, ClSO$_3^-$, CH$_3$SO$_3^-$, C$_6$H$_5$SO$_3^-$, and CF$_3$SO$_3^-$; sulfate ions, such as HSO$_4^-$ and SO$_4^{2-}$; carbonate ions, such as HCO$_3^-$ and CO$_3^{2-}$; phosphate ions, such as H$_2$PO$_4^-$, HPO$_4^{2-}$, and PO$_2^{3-}$; fluorophosphate ions, such as PF$_6^-$, PF$_5$OH⁻, and fluorinated alkyl fluorophosphate ions; borate ions, such as BF$_4^-$, B(C$_6$F$_5$)$_4^-$, and B(C$_6$H$_4$CF$_3$)$_4^-$; AlCl$_4^-$; BiF$_6^-$; and the like. Other examples include fluoroantimonate ions, such as SbF$_6^-$ and SbF$_5$OH⁻; fluoroarsenate ions, such as AsF6⁻ and AsF$_5$OH⁻; and the like.

Examples of the fluorinated alkyl fluorophosphate ion include fluorinated alkyl fluorophosphate ions represented by the formula (4) below and the like.

[Chem. 10]

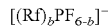  Formula (4)

In the formula (4), Rf denotes an alkyl group substituted by a fluorine atom. The number b of Rf is from 1 to 5 and they are preferably integers. The b of Rf(s) may be identical or different from each other. The number b of Rf is more preferably from 2 to 4 and most preferably from 2 to 3.

In the fluorinated alkyl fluorophosphate ion represented by the formula (4), Rf denotes an alkyl group substituted by a fluorine atom and preferably has a carbon number from 1 to 8 and even more preferably has a carbon number from 1 to 4. Examples of the alkyl group include linear alkyl groups, such as methyl, ethyl, propyl, butyl, pentyl, and octyl; branched alkyl groups, such as isopropyl, isobutyl, sec-butyl, and tert-butyl; cycloalkyl groups, such as cyclopropyl, cyclobutyl, cyclopentyl, and cyclohexyl; and the like. Specific examples include CF$_3$, CF$_3$CF$_2$, (CF$_3$)$_2$CF, CF$_3$CF$_2$CF$_2$, CF$_3$CF$_2$CF$_2$CF$_2$, (CF$_3$)$_2$CFCF$_2$, CF$_3$CF$_2$(CF$_3$)CF, (CF$_3$)$_3$C, and the like.

Specific examples preferred fluorinated alkyl fluorophosphate anions include [(CF$_3$CF$_2$)$_2$PF$_4$]⁻, [(CF$_3$CF$_2$)$_3$PF$_3$]⁻, [(((CF$_3$)$_2$CF)$_2$PF⁴]⁻, [((CF$_3$)$_2$CF)$_3$PF$_3$]⁻, [(CF$_3$CF$_2$CF$_2$)$_2$PF$_4$]⁻, [(CF$_3$CF$_2$CF$_2$)$_3$PF$_3$], [((CF$_3$)$_2$CFCF$_2$)$_2$PF$_4$]⁻, [((CF$_3$)$_2$CFCF$_2$)$_3$PF$_3$]⁻, [(CF$_3$CF$_2$CF$_2$CF$_2$)$_2$PF$_4$]⁻, [(CF$_3$CF$_2$CF$_2$CF$_2$)$_3$PF$_3$]⁻, and the like.

For the photocationic polymerization initiator, an initiator dissolved in solvents and the like in advance may be used to facilitate dissolution in the epoxy compound and the epoxy resin. Examples of the solvents include alcohols, such as methanol, ethanol, n-propyl alcohol, isopropyl alcohol, n-butanol, and isobutanol; ketones, such as acetone, methyl ethyl ketone, methyl isobutyl ketone, methyl n-butyl ketone, methyl n-propyl ketone, cyclopentanone, and cyclohexanone; ethers, such as diethyl ether, ethyl-tert butyl ether, tetrahydrofuran, 1,3-dioxane, and 1,4-dioxane; carbonates, such as propylene carbonate, ethylene carbonate, 1,2-butylene carbonate, dimethyl carbonate, and diethyl carbonate; esters, such as ethyl acetate, ethyl lactate, butyl Cellosolve acetate, carbinol acetate, β-propiolactone, β-butyrolactone, γ-butyrolactone, δ-valerolactone, and ε-caprolactone; monoalkyl glycol ethers, such as ethylene glycol monomethyl ether, ethylene glycol monoethyl ether, propylene glycol monomethyl ether, propylene glycol monoethyl ether, diethylene glycol monomethyl ether, diethylene glycol monoethyl ether, dipropylene glycol monomethyl ether, dipropylene glycol monoethyl ether, triethylene glycol monomethyl ether, triethylene glycol monoethyl ether, tripropylene glycol monomethyl ether, and tripropylene glycol monoethyl ether; dialkyl glycol ethers, such as ethylene glycol dimethyl ether, ethylene glycol diethyl ether, propylene glycol dimethyl ether, propylene glycol diethyl ether, diethylene glycol dimethyl ether, diethylene glycol diethyl ether, dipropylene glycol dimethyl ether, dipropylene glycol diethyl ether, triethylene glycol dimethyl ether, triethylene glycol diethyl ether, tripropylene glycol dimethyl ether, and tripropylene glycol diethyl ether; aliphatic carboxylic acid esters of monoalkyl glycol ether, such as ethylene glycol monomethyl ether acetate, ethylene glycol monoethyl ether acetate, propylene glycol monomethyl ether acetate, and propylene glycol monoethyl ether acetate; aromatic hydrocarbons, such as toluene, xylene, and tetramethylbenzene; aliphatic hydrocarbons, such as hexane, octane, and decane; petroleum-based solvents, such as petroleum ether, petroleum naphtha, hydrogenated petroleum naphtha, and solvent naphtha; nitriles, such as acetonitrile; and the like.

Such photocationic polymerization initiators may be used by selecting one or more of them.

Examples of the anionic species of the photocationic polymerization initiator include halides and the like of, for example, a boron compound, a phosphorus compound, an antimony compound, an arsenic compound, an alkyl sulfonate compound, and the like.

Such anionic species may be used by selecting one or more of them. Among these, fluorides are preferred from the perspective of excellent photocurability and improvement in adhesiveness and adhesion durability. Among fluorides, hexafluoroantimonate is preferred.

The amount of the photocationic polymerization initiator (D) to be used is, based on 100 parts by mass of the component (A), the component (B), and the component (C) in total, preferably from 0.01 to 5 parts by mass and more preferably from 0.05 to 3 parts by mass. When the amount of the photocationic polymerization initiator to be used is 0.01 parts by mass or more, the photocurability is not deteriorated. When the amount is 5 parts by mass or less, the adhesion durability is not reduced.

((E) Stabilizer)

The resin composition in the present embodiment may contain the stabilizer (E). By containing the stabilizer, the resin composition in the present embodiment exhibits excellent storage stability.

Although not being limited in particular, examples of the stabilizer include an antioxidant, an ether compound, and a mixture thereof. Among these, an ether compound is preferred and examples include polyalkylene oxide, such as polyethylene glycol, polypropylene glycol, and polyoxytetramethylene glycol; cyclic ether; and the like. Examples of the cyclic ether include crown ether and the like.

Among the above stabilizers, cyclic ether is preferably used and crown ether is particularly preferably used. By using crown ether, excellent curability that is suitable for manufacture of an organic EL display device is achieved for the added amount.

When polyalkylene oxide is used as the stabilizer, the end of the polyalkylene oxide is not particularly limited. The end may be a hydroxyl group, may be etherified or esterified by another compound, or may be a functional group, such as an epoxy group. Among all, a hydroxyl group, an epoxy group, and the like are preferred because they react with the above photopolymerizable compound.

Further, for the above polyalkylene oxide, a polyalkylene oxide addition bisphenol derivative is also used preferably, and in particular, a compound having a hydroxyl group or an epoxy group at the end is used more preferably.

The above stabilizer preferably has two or more polyethylene glycol and/or polypropylene glycol structures in a molecule.

Among the above stabilizer, examples of a commercially available product of the stabilizer having two or more polyethylene glycol structures in a molecule include "RIKARESIN BEO-60E", "RIKARESIN EO-20" (both produced by New Japan Chemical Co., Ltd.), and the like.

In addition, examples of a commercially available product of the stabilizer having two or more polypropylene glycol structures in a molecule include "RIKARESIN BPO-20E", "RIKARESIN PO-20" (both produced by New Japan Chemical Co., Ltd.), and the like.

The above crown ether is not particularly limited, and examples include 12-crown-4, 15-crown-5, 18-crown-6, dicyclohexano-18-crown-6, and the like.

By containing the stabilizer, not only improvement in storage stability but also adjustment of curing rate is possible, and thus a photocurable resin composition is made that is cured after a certain period of time from light irradiation.

The amount of the stabilizer (E) to be used is, based on 100 parts by mass of the component (A), the component (B), and the component (C) in total, preferably from 0.05 to 20 parts by mass, more preferably from 0.1 to 10 parts by mass, and most preferably from 0.5 to 5 parts by mass. When the amount is 0.05 parts by mass or more, storage stability is improved. When it is 20 parts by mass or less, curability is not reduced.

((F) Silane Coupling Agent)

The resin composition in the present embodiment may further contain the silane coupling agent (F). By containing the silane coupling agent, the resin composition in the present embodiment exhibits excellent adhesiveness and adhesion durability.

In the present embodiment, for the silane coupling agent (F), a compound different from the compound used for the alicyclic epoxy compound (A) is used.

Although not being limited in particular, examples of the silane coupling agent include γ-chloropropyltrimethoxysilane, vinyltrimethoxysilane, vinyltrichlorsilane, vinyltriethoxysilane, vinyl-tris(β-methoxyethoxy)silane, γ-methacryloxypropyltrimethoxysilane, γ-acryloxypropyltrimethoxysilane, β-(3,4-epoxycyclohexyl)ethyltrimethoxysilane, γ-glycidoxypropyltrimethoxysilane, γ-glycidoxypropyltriethoxysilane, γ-mercaptopropyltrimethoxysilane, γ-aminopropyltriethoxysilane, N-β-(aminoethyl)-γ-aminopropyltrimethoxysilane, N-β-(aminoethyl)-γ-aminopropylmethyldimethoxysilane, γ-ureidopropyltriethoxysilane, and the like.

Such silane coupling agents may be used by selecting one or more of them. Among these, one or more of the group consisting of β-(3,4-epoxycyclohexyl)ethyltrimethoxysilane, γ-glycidoxypropyltrimethoxysilane, γ-glycidoxypropyltriethoxysilane, γ-methacryloxypropyltrimethoxysilane, and γ-acryloxypropyltrimethoxysilane are preferred.

The amount of the silane coupling agent (F) to be used is, from the perspective of obtaining adhesiveness and adhesion durability, based on 100 parts by mass of the component (A), the component (B), and the component (C) in total, preferably from 0.1 to 10 parts by mass, more preferably from 0.5 to 8 parts by mass, even more preferably from 1 to 7 parts by mass, and most preferably from 2 to 5 parts by mass.

((G) Photosensitizer)

The resin composition in the present embodiment contains a photosensitizer (G). The photosensitizer refers to a compound that absorbs energy rays to efficiently generate cations from the photocationic polymerization initiator.

Although not being limited in particular, examples of the photosensitizer include benzophenon derivatives, phenothiazine derivatives, phenyl ketone derivatives, naphthalene derivatives, anthracene derivatives, phenanthrene derivatives, naphthacene derivatives, chrysene derivatives, perylene derivatives, pentacene derivatives, acridine derivatives, benzothiazole derivatives, benzoin derivatives, fluorene derivatives, naphthoquinone derivatives, anthraquinone derivatives, xanthene derivatives, xanthone derivatives, thioxanthene derivatives, thioxanthone derivatives, coumarin derivatives, ketocoumarin derivatives, cyanin derivatives, azine derivatives, thiazine derivatives, oxazine derivatives, indoline derivatives, azulene derivatives, triallylmethane derivatives, phthalocyanin derivatives, spiropyran derivatives, spirooxazine derivatives, thiospiropyran derivatives, organic ruthenium complexes, and the like. Among these, phenyl ketone derivatives, such as 2-hydroxy-2-methyl-1-phenyl-propane-1-one, and/or anthracene derivatives, such as 9,10-dibutoxyanthracene, are preferred, phenyl ketone derivatives are more preferred, and 2-hydroxy-2-methyl-1-phenyl-propane-1-one is most preferred.

The amount of the photosensitizer (G) to be used is, from the perspective of not deteriorating the curability and not reducing the storage stability, based on 100 parts by mass of the component (A), the component (B), and the component (C) in total, preferably from 0.1 to 10 parts by mass, more preferably from 0.5 to 5 parts by mass, and most preferably from 1 to 3 parts by mass.

((H) Filler)

The resin composition according to the present embodiment may further contain a filler (H). The filler is preferably microparticles. Although the microparticles are not particularly limited, inorganic or organic transparent microparticles or the like may be used.

Examples of the inorganic microparticles include oxides, such as silica particles, glass fillers, spherical alumina, crushed alumina, magnesium oxide, beryllium oxide, titanium oxide, zirconia, and zinc oxide; nitrides, such as boron nitride, silicon nitride, and aluminum nitride; carbides, such as silicon carbide; hydroxides, such as aluminum hydroxide and magnesium hydroxide; metals and alloys, such as copper, silver, iron, aluminum, nickel, and titanium; carbon-based fillers, such as diamond and carbon; calcium carbonate; barium sulfate; talc; mica; and the like. They may be subjected to surface treatment with fatty acid, a silicone coupling agent, a titanate-based coupling agent, or the like. Examples of the organic microparticles include crosslinked styrene-based particles, crosslinked acryl-based particles, fluorine-modified crosslinked acryl-based particles, crosslinked styrene-acryl based particles, and crosslinked silicone-based particles.

The microparticles preferably have a 50% particle size within a range not less than 0.001 μm and not more than 30 μm. By falling within such range, the particle size is not too small to avoid aggregation and is not too large to avoid sedimentation. For the microparticles, two or more types of them may be used as needed.

Here, the 50% particle size refers to a particle size at a volume cumulative frequency of 50%.

Although not being limited in particular, examples of the method of measuring a particle size include a laser diffraction particle size analyzer, a laser Doppler particle size analyzer, a dynamic light scattering particle size analyzer, an ultrasonic particle size analyzer, and the like.

The amount of the filler (H) to be used is, based on 100 parts by mass of the component (A), the component (B), and the component (C) in total, preferably from 0.01 to 20 parts by mass, more preferably from 0.1 to 10 parts by mass, and most preferably from 0.5 to 5 parts by mass.

The resin composition in the present embodiment may contain another cationic polymerizable compound, such as an aliphatic epoxy compound, an oxetane compound, and a vinyl ether compound.

For the resin composition in the present embodiment, various elastomers, such as acrylic rubber and urethane rubber; graft copolymers, such as a methyl methacrylate-butadiene-styrene based graft copolymer and an acrylonitrile-butadiene-styrene based graft copolymer; and additives, such as a solvent, an extender, a reinforcement, a plasticizer, a thickener, a dye, a pigment, a flame retardant, and a surfactant; may be used.

(Moisture Content)

The resin composition in the present embodiment has a moisture content, from the perspective of inhibiting degradation of the organic EL device, of preferably 1000 ppm or less, more preferably 500 ppm or less, and most preferably 100 ppm or less. When the moisture content is more than 1000 ppm, it is not possible to prevent contact of the moisture contained in the resin composition with the organic EL device, which may lead to degradation of the organic EL device. Examples of the moisture content are 5, 10, 50, 100, 200, 300, 400, 500, 600, 700, 800 ppm, 900 ppm, 1000 ppm or less, and the content may be within a range between any two values listed here. The moisture content of the resin composition has quite an influence on the viscosity of the resin composition. Although it depends on the composition of the resin composition, a greater moisture content in the resin composition often results in lower viscosity.

As a result of extensive examinations, the present inventors found that it is possible to inhibit degradation of an organic EL device even when a resin composition has a greater moisture content. In the related art, there are resin compositions in which the moisture content is determined as not more than an arbitrary value. However, there is no such resin composition with the effect of inhibiting degradation of the organic EL device even when the resin composition has a greater moisture content.

The present embodiment is to inhibit degradation of the organic EL device even when the resin composition has a greater moisture content by further adding the filler (H) to the components (A), (B), (C), and (D).

That is, even in the case where the resin composition contains a lot of moisture content, which was an unrealistic case in the past, the organic EL device is not easily degraded when used for sealing the organic EL device.

For example, it is possible to inhibit degradation of the organic EL device even when the resin composition has a moisture content of more than 700 ppm by further adding the filler (H) to the components (A), (B), (C), and (D).

To the components (A), (B), (C), and (D) and the filler (H), a component other than them may be added. Two or more types of such component other than them may be used as needed.

The resin composition in the present embodiment has a moisture content of, from the perspective of productivity and the like, preferably 50 ppm or more, more preferably 100 ppm or more, even more preferably 300 ppm or more, and most preferably 500 ppm or more. Examples of the moisture content are 50, 100, 200, 300, 400, 500, 600, 700, 800, 900, 1000, 1100, 1200, 1300, 1400, 1500, 1600, 1700, 1800, 1900, 2000, 2500 ppm or more, and the moisture content may be within a range between any two values listed here.

From the perspective of the moisture content of the resin composition, although not particularly limited, the amount of the filler (H) to be used is preferably from 0.1 to 20 parts by mass based on 100 parts by mass of the resin composition in total and more preferably from 1.0 to 10 parts by mass. The content is most preferably from 2.0 to 5.0 parts by mass.

Accordingly, from the perspective of inhibiting degradation of the organic EL device, the moisture content of the resin composition in the present embodiment is preferably 1000 ppm or less when the filler (H) is not contained in the resin composition and preferably 50 ppm or more when the filler (H) is contained in the resin composition. When the filler (H) is contained in the resin composition, from the perspective of inhibiting degradation of the organic EL device, an upper limit of the moisture content of the resin composition in the present embodiment is preferably 2500 ppm or less, more preferably 1500 ppm or less, even more preferably 1000 ppm or less, and most preferably 500 ppm or less. Examples of such moisture content are 50, 100, 200, 300, 400, 500, 600, 700, 800, 900, 1000, 1100, 1200, 1300, 1400, 1500, 1600, 1700, 1800, 1900, 2000, 2500 ppm or less, and the moisture content may be within a range between any two values listed here.

(Viscosity)

To obtain excellent application properties, the resin composition in the present embodiment preferably has shear viscosity at 25° C. of 5 mPa·s or more because the adhesive does not wet extend more than necessary with such viscosity. The shear viscosity is preferably 2000 mPa·s or less because such viscosity enables application with high precision using a commercially available applicator, such as a dispenser. The shear viscosity is more preferably 1000 mPa·s or less. Such viscosity may be within a range between any two values of 5 mPa·s, 10 mPa·s, 25 mPa·s, 50 mPa·s, 75 mPa·s, 100 mPa·s, 250 mPa·s, 500 mPa·s, 750 mPa·s, 1000 mPa·s, and 2000mPa·s.

Second Embodiment: Cured Article

A resin composition in the present embodiment may be cured by energy ray irradiation to make a cured article. During that time, in the present embodiment, the resin composition may be cured by energy ray irradiation using a light source below.

[Light Source]

Although not being limited in particular, examples of the light source used for curing and adhesion of the resin composition in the present embodiment include a halogen lamp, a metal halide lamp, a high power metal halide lamp (containing indium and the like), a low pressure mercury lamp, a high pressure mercury lamp, a super high pressure mercury lamp, a xenon lamp, a xenon excimer lamp, a xenon flash lamp, a light emitting diode (hereinafter, referred to as LED), and the like. These light sources are preferred from the perspective of efficient irradiation of energy rays corresponding to reaction wavelengths of the respective photopolymerization initiators.

Each of the above light sources has a different wavelength and energy distribution. The light sources are therefore selected appropriately for the reaction wavelength of the photopolynnerization initiator or the like. In addition, natural light (sunlight) may be a reaction initiating light source.

Such light source may be irradiated by direct irradiation, focused irradiation with a reflecting mirror and the like, and focused irradiation with fiber and the like. It is also possible to use a low wavelength cutting filter, a heat ray cuffing filter, a cold mirror, and the like.

To accelerate the curing rate after light irradiation, the resin composition in the present embodiment may be subjected to post heating treatment. For sealing of an organic EL device, from the perspective of not damaging the organic EL device, the post heating temperature is preferably 120° C. or less and more preferably 80° C. or less. From the perspective of accelerating the curing rate, the post heating temperature is preferably 30° C. or more and more preferably 40° C. or more.

Third Embodiment: Adhesive

A resin composition in the present embodiment may be used as an adhesive. The adhesive in the present embodiment is preferably used for adhesion of a package and the like of an organic EL device and the like.

Fourth Embodiment: Method of Producing Resin Composition

A method of producing a resin composition in the present embodiment is not particularly limited as long as the above components are mixed sufficiently. Although not being limited in particular, examples of a method of mixing each component include a stirring method utilizing a stirring force associated with rotation of a propeller, a method utilizing a general disperser, such as a planetary stirrer by rotation and revolution, and the like. Such mixing methods are preferred from the perspective of stable mixing at low cost.

[Method of Reducing Moisture Content]

The method of producing a resin composition in the present embodiment preferably includes a step of reducing a moisture content.

Although not being limited in particular, examples of the method of reducing a moisture content include the following methods.

(1) The moisture is removed by desiccant. After removing moisture, the desiccant is separated by decantation or filtration. Although not being limited in particular as long as not affecting the resin composition, examples of the desiccant include a polymer adsorbent (molecular sieve, synthetic zeolite, alumina, silica gel, etc.), inorganic salt (calcium chloride anhydrous, magnesium sulfate, quick lime, anhydrous sodium sulfate, anhydrous calcium sulfate, etc.), solid alkalis (sodium hydroxide, potassium hydroxide, etc.), and the like.

(2) The moisture is removed by heating in a reduced pressure.

(3) Distillation purification is performed in a reduced pressure.

(4) The moisture is removed by blowing an inert gas, such as dry nitrogen and dry argon gas, into each component.

(5) The moisture is removed by freeze drying.

In the reduction of a moisture content, the moisture may be reduced for each component before mixing or the moisture may be reduced after mixing each component. One type of step of reducing a moisture content may be used or two or more types may be used in combination. After the step of reducing a moisture content, to prevent re-entrance of moisture, handling in an inert gas atmosphere is preferred.

Fifth Embodiment: Method of Manufacturing Organic EL Display Device

In a method of manufacturing an organic EL display device using a curable resin composition in the present embodiment, for example, a resin composition in the present embodiment is applied on one substrate (back board) and light is irradiated on the resin composition for activation, followed by blocking of the light to laminate the back board and a substrate having an EL device formed thereon via the composition, thereby sealing without exposing the organic EL device to light and heat.

It is also possible to manufacture an organic EL display device using the present resin composition by a method of irradiating light on the resin composition in the present embodiment in which the resin composition in the present embodiment is applied on one substrate to laminate the other substrate via the resin composition.

That is, the method of manufacturing an organic EL display device in the present embodiment is to seal a moisture proof base material and the organic EL device by lamination by the time, after a sealant for an organic EL device in the present embodiment containing the above stabilizer is applied on all or part of a surface of the moisture proof base material, followed by irradiation of light, the resin composition is cured.

In the method of manufacturing an organic EL display device in the present embodiment, the moisture proof base material and the organic EL device are heated preferably after lamination. By heating after laminating the moisture proof base material and the organic EL device, the curing rate of the resin composition is accelerated.

EXAMPLES

The present invention is described in further details below with Examples. The present embodiments are not limited to them. Unless otherwise indicated, tests were performed at 23° C., at relative humidity of 50 mass %.

The following compounds were used in Examples.

The followings were used as an alicyclic epoxy compound of the component (A).

(A-1) 3,4-epoxycyclohexenylmethyl-3',4'-epoxycyclohexene carboxylate ("Celloxide 2021P" produced by Daicel Chemical Industries, Ltd.)

(A-2) 3,4-epoxycyclohexylmethyl methacrylate ("Cyclomer M100" produced by Daicel Corp.)

(A-3) Hydrogenated bisphenol A epoxy resin ("YX 8000" produced by Mitsui Chemicals, Inc. with a molecular weight from 380 to 430)

(A-4) Dicyclopentadiene epoxy compound ("EP-4088S" produced by ADEKA Corp. with a molecular weight from 300 to 340)

The followings were used as a bisphenol A epoxy resin of the component (B).

(B-1) Bisphenol A epoxy resin ("jER 828" produced by Mitsui Chemicals, Inc. with a molecular weight from 360 to 390)

(B-2) Bisphenol A epoxy resin ("YL 980" produced by Mitsui Chemicals, Inc. with a molecular weight of 240)

The followings were used as a bisphenol F epoxy resin of the component (C). (C-1) Bisphenol F epoxy resin ("jER 806" produced by Mitsui Chemicals, Inc. with a molecular weight from 320 to 340)

(C-2) Bisphenol F epoxy resin ("YL 983U" produced by Mitsui Chemicals, Inc. with a molecular weight from 360 to 380)

(C-3) Bisphenol F epoxy resin ("KRM-2490" produced by ADEKA Corp. with a molecular weight from 340 to 380)

The followings were used as a photocationic polymerization initiator of the component (D).

(D-1) Triaryl sulfonium salt hexafluoroantimonate ("Adeka Optomer SP-170" produced by ADEKA Corp., anionic species is hexafluoroantimonate)

(D-2) Triaryl sulfonium salt ("CPI-200K" produced by San-Apro Ltd., anionic species is a phosphorus compound)

The followings were used as a stabilizer of the component (E).

(E-1) 18-crown-6-ether ("Crown Ether O-18" produced by Nippon Soda Co., Ltd.)

(E-2) 15-crown-5-ether ("Crown Ether O-15" produced by Nippon Soda Co., Ltd.)

(E-3) Dicyclohexano-18-crown-6-ether (produced by Tokyo Chemical Industry Co., Ltd.)

The followings were used as a silane coupling agent of the component (F).

(F-1) γ-glycidoxypropyltrimethoxysilane ("KBM-403" produced by Shin-Etsu Silicone)

(F-2) γ-glycidoxypropyltriethoxysilane ("KBE-403" produced by Shin-Etsu Silicone)

(F-3) 3-methacryloxypropyltrimethoxysilane ("A-174" produced by Momentive Performance Materials Inc.)

The followings were used as a photosensitizer of the component (G).

(G-1) 2-hydroxy-2-methyl-1-phenyl-propane-1-one ("DAROCUR 1173")

(G-2) 9,10-dibutoxyanthracene ("ANTHRACURE UVS-1331" produced by Kawasaki Kasei Chemicals Ltd.)

The followings were used as a filler of the component (H).

(H-1) Silica ("SFP-30M" produced by Denki Kagaku Kogyo Kabushiki Kaisha, average particle size of 0.7 μm)

(H-2) Coupling agent surface treatment silica ("SFP-30MHE" produced by Denki Kagaku Kogyo Kabushiki Kaisha)

(H-3) Hydrophobic surface treatment silica ("R-974" produced by Nippon Aerosil Co., Ltd., average particle size of 12 μm)

(H-4) Alumina ("ASFP-30" produced by Denki Kagaku Kogyo Kabushiki Kaisha, average particle size of 1.7 μm)

Raw materials of the type shown in Tables 1 through 4 were mixed at composition ratios shown in Tables 1 through 4 to prepare resin compositions of Examples. The unit for composition ratio is parts by mass.

In Examples, the following moisture removal step was performed as needed.

After each component was mixed sufficiently, 15 parts by mass of molecular sieve 3A was added based on 100 parts by mass of the resin composition in an inert gas (nitrogen gas) atmosphere and stirred in the condition of a stirring rate from 50 to 200 rpm for 5 to 70 hours. The resin composition after stirring was filtered to obtain resin compositions having a moisture content shown in Tables 1 through 4. The molecular sieve used there was heated at 200° C. or more for 2 hours or more and cooled, followed by storage in a desiccator containing silica gel.

For the resin compositions of Examples, each type of measurement below was performed. The results are shown in Tables 1 through 4.

[Viscosity]

The viscosity (shear viscosity) of the compositions was measured using an E type viscometer in conditions of a temperature at 25° C. and a number of revolutions of 10 rpm.

[Moisture Content]

The moisture content of the resin compositions was measured using a Karl Fischer moisture meter.

[Photocuring Conditions]

For evaluation of curing properties and adhesiveness of the resin compositions, the resin compositions were cured in the following light irradiation conditions. By UV curing equipment with an electrodeless discharge metal halide lamp (manufactured by Fusion UV systems), the resin compositions were photocured in the condition of the integral of light of 4,000 mJ/cm$^2$ at a wavelength of 365 nm, followed by post heating treatment in an oven at 80° C. for 30 min. to obtain a cured article.

[Moisture Permeability]

A cured article in a sheet shape with a thickness of 0.1 mm was prepared in the above photocuring conditions for measurement in accordance with JIS Z0208 "Testing Methods for Determination of the Water Vapour Transmission Rate of Moisture-Proof Packaging Materials (Dish Method)" using (anhydrous) calcium chloride as a moisture absorbent in conditions of at an atmospheric temperature of 60° C. and relative humidity of 90%. The moisture permeability is preferably 120 g/(m$^2$·24 hr) or less. A lower value of moisture permeability is determined as lower in moisture permeability.

[Tensile Shear Adhesion Strength]

Using two borosilicate glass test pieces (length 25 mm×width 25 mm×thickness 2.0 mm, TEMPAX® glass] with an adhesion area of 0.5 cm$^2$ and an adhesion thickness of 80 μm, the resin compositions were cured in the above photocuring conditions. After curing, using the test pieces joined with an adhesive of such resin composition, tensile shear adhesion strength (unit: MPa) was measured at a tensile speed of 10 mm/min. in an environment at a temperature of 23° C. and relative humidity of 50%. A greater value of tensile shear adhesion strength is determined as greater adhesion strength.

[Adhesion Durability (PCT)]

Using two borosilicate glass test pieces (length 25 mm×width 25 mm×thickness 2.0 mm, TEMPAX® glass) with an adhesion area of 0.5 cm$^2$ and an adhesion thickness of 80 μm, the resin compositions were cured in the above photocuring conditions. After curing, the test pieces joined with an adhesive of such resin composition were exposed to 121° C., relative humidity of 100 mass % in an atmosphere of 2 atm of a pressure cooker (hereinafter, referred to as PCT) for 10 hours, and tensile shear adhesion strength (unit: MPa) of the test pieces after exposure was measured at a tensile speed of 10 mm/min. in an environment at a temperature of 23° C. and relative humidity of 50% to determine adhesion retention from (Equation 1) below. The adhesion retention is preferably 40% or more and more preferably 50% or more. The retention is most preferably 75% or more.

Adhesion Retention (%)=(Tensile Shear Adhesion Strength after PCT)/(Initial Tensile Shear Adhesion Strength)×100       (Equation 1)

[Evaluation of Organic Electroluminescence]

[Preparation of Organic EL Device Substrate]

A glass substrate with an ITO electrode was washed with acetone and isopropanol. Then, in vacuum deposition, the compounds below were sequentially deposited to form thin films, and thus an organic EL device substrate was obtained.

Copper phthalocyanin
N,N'-diphenyl-N,N'-dinaphthylbenzidine (α-NPD)
Tris(8-hydroxyquinolinato)aluminum
Lithium fluoride
Aluminum

[Preparation of Organic EL Device]

The resin compositions obtained in Examples were applied on glass in a nitrogen atmosphere by a coater for lamination with the organic EL device substrate. An adhesive of such resin composition was cured with an adhesion thickness of 10 μm in the photocuring conditions to prepare an organic EL device (for evaluation of organic electroluminescence).

[Initial State]

The organic EL device immediately after preparation was exposed to the conditions of 85° C. at relative humidity of 85 mass % for 1000 hours, followed by application of a voltage at 6 V. The state of light emission from the organic EL device was observed visually and with a microscope to measure diameters of dark spots.

The diameters of dark spots are preferably 10 μm or less, more preferably 5 μm, and most preferably no dark spot is present.

[Durability]

The organic EL device immediately after preparation was exposed to the conditions of 85° C. at relative humidity of 85 mass % for 1000 hours, followed by application of a voltage at 6 V. The state of light emission from the organic EL device was observed visually and with a microscope to measure diameters of dark spots.

When the diameters of dark spots are more than 120 μm, durability of the organic EL device is poor. When the diameters of dark spots are 120 μm or less, it was found that degradation of the organic EL device was inhibited. The diameters of dark spots are preferably 100 μm or less, more preferably 50 μm or less, and most preferably no dark spot is present.

[Storage Stability Test]

After the initial viscosity ($V_0$) of the composition was measured, the viscosity ($V_4$) of the composition after 4 weeks was measured in an accelerated test in a high temperature environment at approximately 40° C. in a state of being put in a lidded container (closed system). Then, in accordance with a formula: $V_4/V_0$, a rate of viscosity change was obtained. A smaller rate of viscosity change is determined as better storage stability. The rate of viscosity change is preferably 3.0 or less, more preferably 2.0 or less, and most preferably 1.5 or less.

TABLE 1

| Constituent [parts by mass] | | | Example 1 | Example 2 | Example 3 | Example 4 | Example 5 | Example 6 | Example 7 | Example 8 | Example 9 |
|---|---|---|---|---|---|---|---|---|---|---|---|
| (A) | (A-1) | Celloxide 2021P | 80 | 60 | 40 | | | | 60 | 60 | 60 |
| | (A-2) | Cyclomer M100 | | | | 60 | | | | | |
| | (A-3) | YX-8000 | | | | | 60 | | | | |
| | (A-4) | EP-4088S | | | | | | 60 | | | |
| (B) | (B-1) | jER 828 | 10 | 20 | 30 | 20 | 20 | 20 | | 20 | 20 |
| | (B-1) | YL980 | | | | | | | 20 | | |
| (C) | (C-1) | jER 806 | 10 | 20 | 30 | 20 | 20 | 20 | 20 | | |
| | (C-2) | YL983U | | | | | | | | 20 | |
| | (C-3) | KRM-2490 | | | | | | | | | 20 |
| (D) | (D-1) | Adeka Optomer SP-170 | 1 | 1 | 1 | 1 | 1 | 1 | 1 | 1 | 1 |
| | (D-2) | CPI-200K | | | | | | | | | |
| (E) | (E-1) | Crown Ether O-18 | | | | | | | | | |
| | (E-2) | Crown Ether O-15 | | | | | | | | | |
| | (E-3) | Dicyclohexano-18-Crown-6-Ether | | | | | | | | | |
| (F) | (F-1) | KBM-403 | 3 | 3 | 3 | 3 | 3 | 3 | 3 | 3 | 3 |
| | (F-2) | KBE-403 | | | | | | | | | |
| | (F-3) | A-174 | | | | | | | | | |
| (G) | (G-1) | DAROCUR 1173 | | | | | | | | | |
| | (G-2) | ANTHRACURE UVS-1331 | | | | | | | | | |
| (H) | (H-1) | SFP-30M | | | | | | | | | |
| | (H-2) | SFP-30MHE | | | | | | | | | |
| | (H-3) | R-974 | | | | | | | | | |
| | (H-4) | ASFP-30 | | | | | | | | | |
| Moisture Content | ppm | | 100 | 100 | 100 | 100 | 300 | 100 | 100 | 100 | 200 |
| Viscosity [mPa · s] at 25° C. | | | 350 | 700 | 1,200 | 350 | 2,300 | 630 | 720 | 710 | 700 |
| Moisture Permeability [g/(m² · 24 hr)] | 60° C., 90% RH | | 75 | 55 | 43 | 49 | 45 | 40 | 43 | 44 | 44 |
| Tensile Shear Adhesion Strength | MPa | | 34 | 30 | 30 | 22 | 29 | 38 | 32 | 33 | 28 |
| Adhesion Durability (PCT) [%] | 121° C., 100% RH, 2 atm, after 10 hrs | | 80 | 80 | 80 | 75 | 85 | 90 | 85 | 85 | 80 |
| Organic Electroluminescence Evaluation [μm] | Initial Period | | 0 | 0 | 0 | 0 | 0 | 0 | 0 | 0 | 0 |
| | Durability (85° C. 85% RH) after 1000 hrs | | 10 | 0 | 0 | 10 | 5 | 5 | 5 | 5 | 5 |
| Storage Stability Evaluation | 40° C., after 4 weeks Rate of Viscosity Change ($V_4/V_0$) | | 1.7 | 1.7 | 1.7 | 1.9 | 2.2 | 3.0 | 1.8 | 1.9 | 1.7 |

TABLE 2

| | Constituent [parts by mass] | | Example 10 | Example 11 | Example 12 | Example 13 | Example 14 | Example 15 | Example 16 | Example 17 | Example 18 |
|---|---|---|---|---|---|---|---|---|---|---|---|
| (A) | (A-1) | Celloxide 2021P | 60 | 60 | 60 | 60 | 60 | 60 | 60 | 60 | 60 |
| | (A-2) | Cyclomer M100 | | | | | | | | | |
| | (A-3) | YX-8000 | | | | | | | | | |
| | (A-4) | EP-4088S | | | | | | | | | |
| (B) | (B-1) | jER 828 | 20 | 20 | 20 | 20 | 20 | 20 | 20 | 20 | 20 |
| | (B-1) | YL980 | | | | | | | | | |
| (C) | (C-1) | jER 806 | 20 | 20 | 20 | 20 | 20 | 20 | 20 | 20 | 20 |
| | (C-2) | YL983U | | | | | | | | | |
| | (C-3) | KRM-2490 | | | | | | | | | |
| (D) | (D-1) | Adeka Optomer SP-170 | | 1 | 1 | 1 | 1 | 1 | 1 | 1 | 1 |
| | (D-2) | CPI-200K | 1 | | | | | | | | |
| (E) | (E-1) | Crown Ether O-18 | | 1 | | | 1 | 1 | 1 | 1 | 1 |
| | (E-2) | Crown Ether O-15 | | | 1 | | | | | | |
| | (E-3) | Dicyclohexano-18-Crown-6-Ether | | | | 1 | | | | | |
| (F) | (F-1) | KBM-403 | 3 | 3 | 3 | 3 | 1 | | | 3 | 3 |
| | (F-2) | KBE-403 | | | | | | 3 | | | |
| | (F-3) | A-174 | | | | | | | 3 | | |
| (G) | (G-1) | DAROCUR 1173 | | | | | | | | 2 | |
| | (G-2) | ANTHRACURE UVS-1331 | | | | | | | | | 0.5 |
| (H) | (H-1) | SFP-30M | | | | | | | | | |
| | (H-2) | SFP-30MHE | | | | | | | | | |
| | (H-3) | R-974 | | | | | | | | | |
| | (H-4) | ASFP-30 | | | | | | | | | |
| Moisture Content | ppm | | 100 | 100 | 100 | 100 | 100 | 100 | 100 | 100 | 100 |
| | Viscosity [mPa · s] at 25° C. | | 700 | 700 | 700 | 700 | 730 | 700 | 700 | 680 | 700 |
| Moisture Permeability [g/(m² · 24 hr)] | 60° C., 90% RH | | 55 | 45 | 50 | 50 | 45 | 45 | 65 | 45 | 45 |
| Tensile Shear Adhesion Strength | MPa | | 31 | 33 | 30 | 30 | 28 | 30 | 32 | 45 | 42 |
| Adhesion Durability (PCT) [%] | 121° C., 100% RH, 2 atm, after 10 hrs | | 80 | 80 | 80 | 85 | 65 | 75 | 75 | 80 | 80 |
| Organic Electroluminescence Evaluation [µm] | Initial Period | | 0 | 0 | 0 | 0 | 0 | 0 | 0 | 0 | 0 |
| | Durability (85° C. 85% RH) after 1000 hrs | | 10 | 0 | 0 | 0 | 10 | 0 | 15 | 5 | 5 |
| Storage Stability Evaluation | 40° C., after 4 weeks Rate of Viscosity Change ($V_4/V_0$) | | 1.6 | 1.0 | 1.1 | 1.2 | 1.1 | 1.1 | 1.1 | 1.1 | 1.1 |

TABLE 3

| | Constituent [parts by mass] | | Example 19 | Example 20 | Example 21 | Example 22 | Example 23 | Example 24 | Example 25 |
|---|---|---|---|---|---|---|---|---|---|
| (A) | (A-1) | Celloxide 2021P | 60 | 60 | 60 | 60 | 60 | 60 | 60 |
| | (A-2) | Cyclomer M100 | | | | | | | |
| | (A-3) | YX-8000 | | | | | | | |
| | (A-4) | EP-4088S | | | | | | | |
| (B) | (B-1) | jER 828 | 20 | 20 | 20 | 20 | 20 | 20 | 20 |
| | (B-1) | YL980 | | | | | | | |
| (C) | (C-1) | jER 806 | 20 | 20 | 20 | 20 | 20 | 20 | 20 |
| | (C-2) | YL983U | | | | | | | |
| | (C-3) | KRM-2490 | | | | | | | |
| (D) | (D-1) | Adeka Optomer SP-170 | 1 | 1 | 1 | 1 | | | |
| | (D-2) | CPI-200K | | | | | 1 | 1 | 1 |
| (E) | (E-1) | Crown Ether O-18 | 1 | 1 | 1 | 1 | | | |
| | (E-2) | Crown Ether O-15 | | | | | | | |
| | (E-3) | Dicyclohexano-18-Crown-6-Ether | | | | | | | |
| (F) | (F-1) | KBM-403 | 3 | 3 | 3 | 3 | 3 | 3 | 3 |
| | (F-2) | KBE-403 | | | | | | | |
| | (F-3) | A-174 | | | | | | | |
| (G) | (G-1) | DAROCUR 1173 | | | | | | | |
| | (G-2) | ANTHRACURE UVS-1331 | | | | | | | |

TABLE 3-continued

| Constituent [parts by mass] | | Example 19 | Example 20 | Example 21 | Example 22 | Example 23 | Example 24 | Example 25 |
|---|---|---|---|---|---|---|---|---|
| (H) | (H-1) SFP-30M | 3 | | | | 3 | 3 | 10 |
| | (H-2) SFP-30MHE | | 3 | | | | | |
| | (H-3) R-974 | | | 3 | | | | |
| | (H-4) ASFP-30 | | | | 3 | | | |
| Moisture Content ppm | | 600 | 500 | 500 | 300 | 1100 | 1800 | 1800 |
| Viscosity [mPa·s] at 25° C. | | 720 | 740 | 750 | 720 | 600 | 400 | 400 |
| Moisture Permeability [g/(m²·24 hr)] | 60° C., 90% RH | 40 | 40 | 42 | 45 | 55 | 60 | 62 |
| Tensile Shear Adhesion Strength | MPa | 32 | 30 | 30 | 31 | 31 | 28 | 26 |
| Adhesion Durability (PCT) [%] | 121° C., 100% RH, 2 atm, after 10 hrs | 85 | 85 | 85 | 85 | 80 | 65 | 45 |
| Organic Electroluminescence Evaluation [μm] | Initial Period | 0 | 0 | 0 | 0 | 0 | 0 | 0 |
| | Durability (85° C. 85% RH) after 1000 hrs | 10 | 5 | 10 | 5 | 10 | 10 | 10 |
| Storage Stability Evaluation | 40° C., after 4 weeks Rate of Viscosity Change ($V_4/V_0$) | 1.1 | 1.1 | 1.1 | 1.1 | 1.8 | 1.9 | 1.9 |

TABLE 4

| Constituent [parts by mass] | | | Example 26 | Example 27 | Example 28 | Example 29 | Example 30 | Example 31 |
|---|---|---|---|---|---|---|---|---|
| (A) | (A-1) | Celloxide 2021P | 100 | 100 | 60 | 60 | | 60 |
| | (A-2) | Cyclomer M100 | | | | | | |
| | (A-3) | YX-8000 | | | | | | |
| | (A-4) | EP-4088S | | | | | | |
| (B) | (B-1) | jER 828 | | | 40 | | 100 | 20 |
| | (B-1) | YL980 | | | | | | |
| (C) | (C-1) | jER 806 | | | | 40 | | 20 |
| | (C-2) | YL983U | | | | | | |
| | (C-3) | KRM-2490 | | | | | | |
| (D) | (D-1) | Adeka Optomer SP-170 | 1 | 1 | 1 | 1 | 1 | |
| | (D-2) | CPI-200K | | | | | | 1 |
| (E) | (E-1) | Crown Ether O-18 | | | | | | |
| | (E-2) | Crown Ether O-15 | | | | | | |
| | (E-3) | Dicyclohexano-18-Crown-6-Ether | | | | | | |
| (F) | (F-1) | KBM-403 | 3 | 3 | 3 | 3 | 3 | 3 |
| | (F-2) | KBE-403 | | | | | | |
| | (F-3) | A-174 | | | | | | |
| (G) | (G-1) | DAROCUR 1173 | | | | | | |
| | (G-2) | ANTHRACURE UVS-1331 | | | | | | |
| (H) | (H-1) | SFP-30M | | | | | | |
| | (H-2) | SFP-30MHE | | | | | | |
| | (H-3) | R-974 | | | | | | |
| | (H-4) | ASFP-30 | | | | | | |
| Moisture Content ppm | | | 1500 | 100 | 300 | 300 | 300 | 1200 |
| Viscosity [mPa·s] at 25° C. | | | 220 | 220 | 1,000 | 500 | 13,000 | 500 |
| Moisture Permeability [g/(m²·24 hr)] | 60° C., 90% RH | | 130 | 130 | 68 | 42 | 50 | 68 |
| Tensile Shear Adhesion Strength | MPa | | 22 | 21 | 28 | 21 | 23 | 22 |
| Adhesion Durability (PCT) [%] | 121° C., 100% RH, 2 atm, after 10 hrs | | 80 | 80 | 80 | 45 | 30 | 45 |
| Organic Electroluminescence Evaluation [·m] | Initial Period | | 40 | 0 | 10 | 10 | 15 | 12 |
| | Durability (85° C. 85% RH) after 1000 hrs | | 450 | 250 | 200 | 230 | 130 | 140 |
| Storage Stability Evaluation | 40° C., after 4 weeks Rate of Viscosity Change ($V_4/V_0$) | | 3.1 | 3.1 | 2.1 | 2.1 | 2.1 | 2.3 |

From Examples above, the followings were found.

In Examples 1-25, in the durability of the organic electroluminescence evaluation, all dark spots have the diameters of 120 µm or less. That is, it was found that, in Examples 1-25, degradation of the organic EL device was inhibited. In Examples 23-25, by using a filler, it was possible to inhibit degradation of the organic EL device even when the moisture content of the resin compositions was over 1000 ppm.

In Examples 26-31, in the durability of the organic electroluminescence evaluation, the diameters of dark spots were more than 120 µm. Accordingly, the organic EL devices had poor durability. In Examples 26-31, it was not possible to inhibit degradation of the organic EL device.

The present embodiments provide an excellent resin composition that is capable of inhibiting degradation of the organic EL device. In addition, the resin composition is excellent in application properties with high precision, adhesiveness, low moisture permeability, and adhesion durability even in a trace amount of use. The fact that the resin composition in the present embodiment has low moisture permeability is supported by the low moisture permeability. For example, when the component (E) was used in Examples, the low moisture permeability of the organic EL devices was improved. In addition, by using the filler (H) in Examples, inhibition of degradation of the organic EL devices was supported even when the resin compositions had a greater moisture content.

INDUSTRIAL APPLICABILITY

The resin composition of the present invention is capable of inhibiting degradation of the organic EL device. The resin composition of the present invention is preferably applied for adhesion of electronics products, in particular, display parts such as an organic EL device and electronics such as an image sensor like a CCD and a CMOS, and further element packages used for semiconductor components. In particular, the resin composition is optimum for adhesion for sealing organic EL devices and it satisfies properties required for an adhesive for an element package, such as an organic EL device. The resin composition of the present invention is also applicable to a display or an organic EL apparatus with flexibility.

The invention claimed is:

1. A method of producing a resin composition, the method comprising the step of:
    reducing moisture after mixing each component of the resin composition, wherein the resin composition comprises the following components:
    (A) an alicyclic epoxy compound;
    (B) a bisphenol A epoxy resin;
    (C) a bisphenol F epoxy resin; and
    (D) a photocationic polymerization initiator,
wherein the bisphenol A epoxy resin (B) and the bisphenol F epoxy resin (C) are compounds not having the alicyclic epoxy compound (A),
    an amount of component (A) is 40 parts by mass or more based on 100 parts by mass of (A), (B), and (C) in total, and
    the resin composition satisfies any one of the following characteristics of the items (i) and (ii):
    (i) the resin composition has a moisture content of 1000 ppm or less, and
    (ii) the resin composition further comprises a filler (H) and has a moisture content of 50 ppm or more.

2. The method according to claim 1, wherein
the step of reducing moisture after mixing each component includes one or more steps selected from the group consisting of:
    (a) removing moisture by desiccant, and after removing moisture, separating the desiccant by decantation or filtration;
    (b) removing moisture by heating in a reduced pressure;
    (c) distillation purification in a reduced pressure;
    (d) removing moisture by blowing an inert gas into each component; and
    (e) removing moisture by freeze drying.

3. The method according to claim 1, wherein the resin composition further comprises a stabilizer (E).

4. The method according to claim 3 wherein the stabilizer (E) is an ether compound.

5. The method according to claim 4, wherein the stabilizer (E) is a cyclic ether compound.

6. The method according to claim 1, wherein the alicyclic epoxy compound (A) does not have an aromatic group.

7. The method according to claim 1, wherein the resin composition further comprises a silane coupling agent (F).

8. The method according to claim 1, wherein the resin composition further comprises a sensitizer (G).

9. The method according to claim 1, wherein the resin composition has a moisture content from not less than 50 ppm to not more than 700 ppm.

10. The method according to claim 1, wherein the resin composition has shear viscosity not less than 5 mPa·s and not more than 2000 mPa·s at 25° C.

11. A sealant for an organic EL device, comprising the resin composition produced by the method according to claim 1.

12. A cured article comprising the resin composition produced by the method according to claim 1, the resin composition being cured therein.

13. An organic EL apparatus comprising the resin composition produced by the method according to claim 1, the resin composition being used therein.

14. A display comprising the resin composition produced by the method according to claim 1, the resin composition being used therein.

15. A display or an organic EL apparatus with flexibility comprising the resin composition produced by the method according to claim 1, the resin composition being used therein.

16. A method of manufacturing an organic EL apparatus, comprising the steps of:
    irradiating light after applying the sealant for an organic EL device according to claim 11 on all or part of a surface of a base material; and
    sealing an organic EL device by laminating the base material and the organic EL device by the time the sealant for an organic EL device is cured.

* * * * *